United States Patent [19]

Bradley

[11] Patent Number: 5,022,038

[45] Date of Patent: Jun. 4, 1991

[54] WAVELENGTH TUNABLE DIODE LASER

[75] Inventor: Eric M. Bradley, San Diego, Calif.

[73] Assignee: General Dynamics Corp./Electronics Division, San Diego, Calif.

[21] Appl. No.: 458,133

[22] Filed: Dec. 28, 1989

[51] Int. Cl.[5] .............................................. H01S 3/19
[52] U.S. Cl. ........................................ 372/50; 372/20; 372/96
[58] Field of Search ...................... 372/50, 20, 32, 96, 372/99

[56] References Cited

U.S. PATENT DOCUMENTS

| | | | |
|---|---|---|---|
| 3,891,302 | 6/1975 | Dabby et al. | 350/96 |
| 4,464,762 | 8/1984 | Furuya | 372/50 |
| 4,556,979 | 12/1985 | Scott et al. | 372/20 |
| 4,592,058 | 5/1986 | Mongeon et al. | 372/32 |
| 4,669,086 | 5/1987 | Kaede et al. | 372/32 |
| 4,803,692 | 2/1989 | Sakano et al. | 372/50 |
| 4,914,667 | 4/1990 | Blonder et al. | 372/50 |

Primary Examiner—Georgia Epps
Attorney, Agent, or Firm—Brown, Martin, Haller & McClain

[57] ABSTRACT

An apparatus for generating a variable wavelength optical signal. The apparatus includes a signal generator for generating an optical signal. A reflector receives a portion of the optical signal and an electrical tuning signal. The reflector is responsive to the optical and tuning signals, reflecting a selected spectral component of the optical signal back to the signal generator. The generator receives the selected spectral component and responds by stabilizing the wavelength of its output at the wavelength of the spectral component.

5 Claims, 1 Drawing Sheet

WAVELENGTH TUNABLE DIODE LASER

BACKGROUND OF THE INVENTION

I. Technical Field

The present invention relates to light sources useful in communication and computation systems employing optical frequency signals. More specifically, the present invention relates to light emitting devices having controllable emission wavelength.

II. Background Art

Wavelength division multiplexed (WDM) databuses are becoming more common as the implementation of optical communication and computation systems increases. A necessary feature of a WDM system is an optical source or sources capable of providing a plurality of optical wavelengths for use in multiplexing, demultiplexing and/or modulating the optical signals employed. The efficiency of such a WDM system is strongly dependent on both the number of integrated optical sources required to cover the entire wavelength band utilized by the particular system, and the number of channels which can be effectively used within that wavelength band. The number of channels per band is typically limited by the width of the discrete spectral peaks the source or sources are capable of generating.

It is therefore an object of the present invention to provide an optical source capable of varying its output across a wide wavelength band in very narrow wavelength increments.

SUMMARY OF THE INVENTION

The present invention provides a novel and improved method and apparatus for generating an optical emission which may vary across a wide wavelength band in very narrow wavelength increments.

The apparatus of the present invention is a light emitting device for generating an output optical signal having a variable wavelength. In the preferred embodiment the present invention includes a signal generation means, typically a Fabry-Perot cavity diode laser, for generating an optical signal. The output optical signal exits the generation means at first and second faces. The emission from the second face is in the direction of a reflective feedback means, typically an electrically tunable Distributed Bragg Reflector, which shares a common optical axis with the signal generation means. The feedback means of the present invention bears some similarity to the tunable filter described in copending U.S. Patent Application, Ser. No. 07/458,156, filed Dec. 28, 1989, entitled "WIDE LINEAR DYNAMIC RANGE OPTICAL MODULATOR" assigned to the assignee of the present invention. The feedback means is for reflecting a selected spectral component of the output optical signal back to the signal generation means. The spectral components selected varies in response to an electrical tuning signal. The reflected signal serves to stabilize the laser's emission at the wavelength of the reflected signal.

The present invention further provides a method for generating an optical signal having a variable wavelength. The method includes emitting an output optical signal from the first and second faces of a laser. A selected spectral component of the emission from the second face is reflected back into the second face in order to stabilize the laser's emission at the selected components wavelength. The spectral component is varied, thereby varying the wavelength of the output optical signal.

In the preferred embodiment a tunable optical waveguide is formed in an electro-optically material such as a Pb, La, Zi and Ta (PLZT) based oxide or Lithium Niobate ($LiNbO_3$). Electrodes are deposited on either side of the waveguide to utilize the transverse electro-optic effect exhibited by PLZT. A dielectric material may be deposited on top of the waveguide. A Bragg reflection grating is then formed on top of the waveguide or dielectric layer.

An electric field is applied through the waveguide via the application of the electric tuning signal to the electrodes. When the field is varied the effective refractive index of the waveguide is altered, thus changing the effective center frequency of the Bragg grating.

The waveguide is coupled to one of two emitting faces of a Fabry-Perot diode laser. The spectral component to which the waveguide is tuned is reflected back into the active region of the laser, thereby stabilizing the laser's emission at the selected component's wavelength. The waveguide is fabricated such that the losses in the waveguide are maintained typically around 1 dB/cm. Low loss allows the grating to yield a narrow reflection peak sufficient to provide accurate wavelength tuning in 1 Å increments. Wavelength tuning on the order of 1 Å increments allows for approximately 100 channels within the gain spectrum of typical III-V diode laser formed from materials such as GaAs or InP. Furthermore, the change in refractive index of PLZT varies with the change in the square of the tuning electric field. The quadratic relationship allows a relatively narrow field variation to cover the entire gain spectrum of a typical III-V laser.

BRIEF DESCRIPTION OF THE DRAWINGS

These and other features, and advantages of the invention will become fully apparent from the detailed description set forth below when taken in conjunction with the drawings in which like reference characters correspond throughout and wherein.

DETAILED DESCRIPTION OF THE PREFERRED EMBODIMENT

Figure 1:
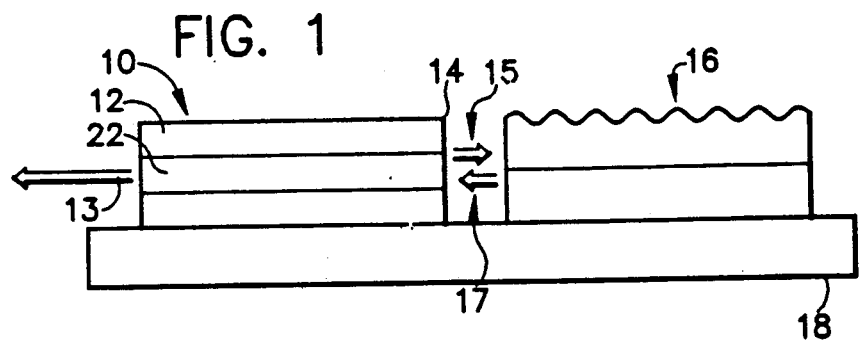
FIG. 1 illustrates a side elevational view of the wavelength tunable light emitting device of the present invention.

A schematic diagram of the preferred embodiment of the present invention is shown in FIG. 1. Diode laser 10 serves as a signal generation means for generating an output optical signal. This optical signal is emitted through faces 12 and 14 of laser 10, as indicated by arrows 13 and 15 respectively.

Tunable Distributed Bragg Reflector (DBR) or filter 16 shares a common optical axis with diode laser 10. Filter 16 is for reflecting a selected spectral component of the output signal generated by laser 10 back into face 14 of laser 10, as indicated by arrow 17. The spectral component selected for reflection varies in response to an electrical tuning signal applied to filter 16.

FIG. 1 further illustrates substrate 18. Substrate 18 provides a common surface upon which laser 10 and filter 16 are formed. A common substrate results in the tunable light emitting device of the present invention being of a monolithic design. Being monolithic, the light emitting device provides additional advantages including economy of space and power, and improved performance under thermal variation and mechanical vibration.

In the configuration shown in FIG. 1, diode laser 10 and filter 16 are separated by a selected distance forming a gap therebetween. However, in a slightly varied configuration, laser 10 may abut filter 16.

Laser 10 is typically fabricated of III-V semiconductor compounds such as GaAs or InP. In the preferred embodiment, laser 10 is a Fabry-Perot cavity diode laser having partially reflective mirrors making faces 12 and 14. Laser 10 further has an active region or cavity 22 wherein the output optical signal originates.

Figure 2:
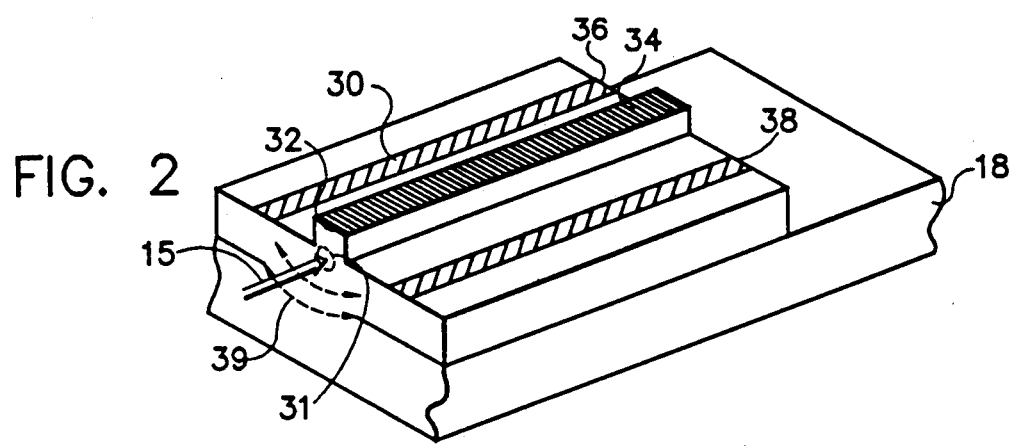
FIG. 2 shows a perspective view of the reflective feedback means of the present invention.

FIG. 2 illustrates in more detail the tunable DBR or filter of the present invention. FIG. 2 shows substrate 18 upon which is formed electro-optically active layer 30. Layer 30 comprises a material whose optical transmission characteristics are responsive to a varying electric field passing through the material. In the preferred embodiment layer 30 comprises an oxide whose structure includes the elements, Pb, La, Zi and Ta (PLZT).

Elongated mesa 32 is formed in layer 30 and serves as an optical waveguide for receiving the output optical signal and reflecting the selected spectral component back to the laser. The received output optical signal travels through filter 16 substantially confined to an area demarcated by the dashed line circle 31.

Corrugated grating 34 is formed in the top of mesa 32, and has striations of the grating running transverse to the optical axis of mesa 32. Grating 34 is typically formed using electron beam or holographic photolithographic techniques. In the preferred embodiment grating 34 is substantially sinusoidal in shape when viewed in cross-section taken along the optical axis.

Filter 16 further includes electrodes 36 and 38 which comprise elongated strips of conductive material formed on either side of mesa 32, running substantially the length of the mesa. Electrodes 36 and 38 are utilized as a means for inducing an electric field through mesa 32 and a portion of layer 30 therebeneath. The induced electric field runs transverse to the optical axis of mesa 32 as indicated by field lines 39. Electrodes 36 and 38 are typically formed using deposition methods known in the art.

Figure 3:
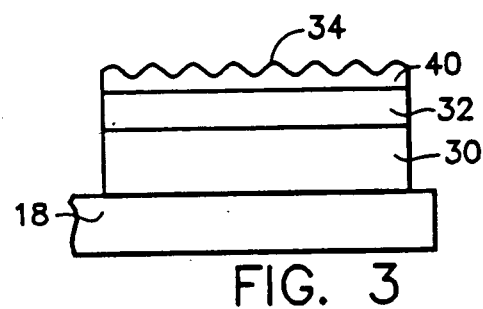
FIG. 3 illustrates a side elevational view of an alternative configuration of the reflective feedback means of FIG. 1.

FIG. 3 shows a side view of an alternate configuration of filter 16. The alternate configuration further includes dielectric layer 40 forming a surface on top of mesa 32', into which corrugated grating 34' is formed.

Laser 10 of the present invention is typically a III-V compound laser and therefore has a gain spectrum covering approximately 100 Å. Filter 16, having a loss of around 1 dB/cm, typically has a 3 dB reflection peak of a width less than 1 Å. The reflection peak of filter 16 lies within the gain band of the laser.

Figure 4:
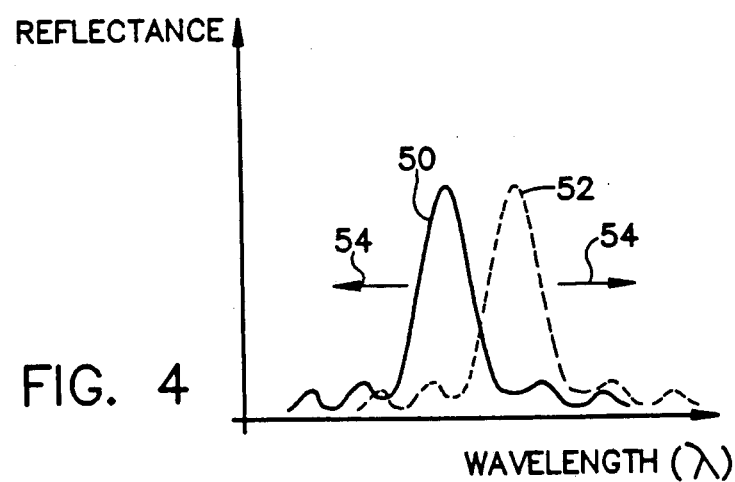
FIG. 4 shows graphically an exemplary reflection spectrum of the reflective feedback means of the present invention, and the variation of the reflection spectrum in response to the variation of an electrical tuning signal.

Curve 50 of FIG. 4 is an exemplary view of the reflection response of filter 16. When filter 16 is coupled to laser 10, as in the present invention, light corresponding to the filter reflection peak is fed back into laser 10. The feedback has the effect of increasing the laser emission at the wavelength of the reflection peak, thereby stabilizing the laser emission at that wavelength.

The effective index of refraction of an electro-optically active material such as PLZT based oxide is varied in proportion to the variation of the square of the strength of an electric field passing through the material. Therefore filter 16 is capable of shifting the center wavelength of its reflection peak in response to an electrical tuning signal provided across electrodes 36 and 38. Curves 50 and 52 of FIG. 4 illustrate the reflection spectrum of filter 16 at two different potentials across electrodes 36 and 38. Arrows 54 indicate the movement of the reflection peak in response to the variation of the electrical tuning signal. As the reflection peak of filter 16 shifts, the emission of laser 10 shifts correspondingly. Thus, the present invention provides a wavelength tunable light emitting device having narrow increment tunability over a wide wavelength band.

It is a significant advantage of the electro-optic materials such as $LiNbO_3$ and PLZT proposed here for use in the tunable Distributed Bragg Reflector. The power dissipation in such devices using these materials can be much less, than for similar devices utilizing current injected into III-V semiconductor material. This lower power dissipation is a result of that once the voltage has been applied and is held at a constant value, corresponding to holding the laser wavelength at a constant value, the present device is much like a capacitor which has been fully charged, i.e. it draws no current. The devices utilizing current injection into III-V materials draw a constant current while holding the laser at a constant wavelength. Since most WDM systems use the laser at a constant wavelength for relatively long periods of time with infrequent switching, this would result in large reductions in power consumption for WDM systems having large numbers of lasers.

The previous descriptions of the preferred embodiments are provided to enable any person skilled in the art to make or use the present invention. Various modifications to these embodiments will be readily apparent to those skilled in the art without the use of the inventive facility. Thus, the present invention is not intended to be limited to the embodiments shown herein, but is to be accorded the widest scope consistent with the principal and novel features enclosed herein.

I claim:

1. An apparatus for generating a variable wavelength output optical signal comprising:

signal generation means for generating said output optical signal;

reflective feedback means sharing a common optical axis with said signal generation means, for receiving a portion of said output optical signal and for receiving an electrical tuning signal, said reflective feedback means comprising:

an optical waveguide formed of electro-optically active material;

a dielectric layer forming a surface on top of said waveguide and having a corrugated grating topology along a face parallel to the optical axis of said waveguide, wherein striations of said grating are transverse to said optical axis;

tuning means, comprising first and second electrodes disposed on opposite sides of said waveguide for inducing, in response to said electrical tuning signal, an electrical field through said waveguide transverse to said optical axis;

whereby said reflective feedback means is responsive to said electrical tuning signal so that a selected spectral component of said output optical signal portion having a certain wavelength is reflected along said optical axis in the direction of said signal generation means; and said signal generation means for receiving said selected spectral component and responsive thereto for emitting said output optical signal at said certain wavelength.

2. The apparatus of claim 1 wherein said corrugation is substantially sinusoidal in shape.

3. An apparatus for generating a variable wavelength output optical signal comprising:

A semiconductor laser for generating said output optical signal; and a tunable Distributed Bragg Reflector sharing a common optical axis with said laser comprising:

a semiconductor substrate;

an electro-optically active layer formed upon said substrate, said active layer further defining an elongated mesa having a corrugated grating topology along a face parallel to the elongation of said mesa wherein striations of said grating are transverse to said optical axis; and first and second electrodes comprising elongated strips of conductive material formed on either side of said mesa on said electro-optically active layer, running substantially the length of said mesa.

4. An apparatus for generating an output optical signal having a variable wavelength comprising:

a semiconductor laser for generating said output optical signal; and a tunable Distributed Bragg Reflector sharing a common optical axis with said laser comprising:

a semiconductor substrate;

an electro-optically active layer formed upon said substrate, said active layer further defining an elongated mesa;

a dielectric layer formed upon said mesa having a corrugated grating topology along a face parallel to the elongation of said mesa wherein striations of said grating are transverse to said optical axis; and first and second electrodes comprising elongated strips of conductive material formed on either side of said mesa on said electro-optically active layer, running substantially the length of said mesa.

5. A method for producing a variable wavelength optical signal comprising the steps of:

emitting an output optical signal from a first and a second face of a laser;

extracting a selected spectral component from said output optical signal emitted from said laser second face;

reflecting said selected spectral component of said output optical signal into said laser at said second face by coupling said output optical signal into a distributed Bragg reflector having a waveguide fabricated of electro-optically active material and sharing a common optical axis with said laser, said waveguide having a reflectance peak with a center wavelength; and varying said selected spectral component so as to vary the wavelength of said output optical signal as output from said laser first face by varying the magnitude of an electric field through said waveguide by applying an electric signal across two electrodes, one electrode on each side of said waveguide, so as to shift said center wavelength of said reflectance peak of said waveguide.

* * * * *